United States Patent [19]
Sandhu et al.

[11] Patent Number: 5,254,499
[45] Date of Patent: Oct. 19, 1993

[54] METHOD OF DEPOSITING HIGH DENSITY TITANIUM NITRIDE FILMS ON SEMICONDUCTOR WAFERS

[75] Inventors: Gurtej S. Sandhu; Trung T. Doan; Scott G. Meikle, all of Boise, Id.

[73] Assignee: Micron Technology, Inc., Boise, Id.

[21] Appl. No.: 914,748

[22] Filed: Jul. 14, 1992

[51] Int. Cl.$^5$ .......................................... H01L 21/283
[52] U.S. Cl. ................................... 437/192; 437/245; 427/255.2
[58] Field of Search ..................... 437/190, 192, 245; 427/255.2

[56] References Cited

U.S. PATENT DOCUMENTS 5,089,438  2/1992  Katz ..................................... 437/190
5,139,825  8/1992  Gordon et al. .................. 427/255.2

FOREIGN PATENT DOCUMENTS 2-259073  10/1990  Japan ............................... 427/255.2

OTHER PUBLICATIONS

Ishihara, K., et al., "Characterization of . . . ", *Japanese J. Appl. Phys.*, 29(10), Oct. 1990, pp. 2103-2105.

Katz, A., "The Influence of Ammonia on Rapid-Thermal Low-Pressure Metalorganic Chemical Vapor Deposited TiN$_x$ Films from Tetrakis (dimethylamido) Titanium Precursor Onto InP", *J. Appl. Phys.*, 71(2), Jan. 15, 1992, pp. 993-1000.

Katz, A., Ohmic Contacts to InP-Based Materials Induced by Means of Rapid Thermal Low Pressure (Metallorganic) Chemical Vapor Deposition Technique, May 4, 1991; *Journal of Electronic Materials*, vol. 20, No. 12, pp. 1069-1073.

*Primary Examiner*—T. N. Quach
*Attorney, Agent, or Firm*—Wells, St. John, Roberts, Gregory & Matkin

[57] ABSTRACT

Disclosed is a chemical vapor deposition method of providing a conformal layer of TiN atop a semiconductor wafer in a manner which increases density and reduces etch rate of the TiN layer. The method comprises: a) positioning a wafer within a chemical vapor deposition reactor; b) heating the positioned wafer to a selected processing temperature of from about 200° C. to about 600° C.; c) injecting selected quantities of a gaseous titanium organometallic precursor of the formula $Ti(NR_2)_4$, where R is selected from the group consisting of H and a carbon containing radical; gaseous ammonia; and a carrier gas to within the reactor having the positioned preheated wafer therein; and d) maintaining the reactor at a pressure of from about 5 Torr to about 100 Torr and the wafer at a selected elevated temperature which in combination are effective for reacting the precursor and ammonia to deposit a film on the wafer which comprises TiN, the film having increased density and reduced etch rate over films deposited by the same method but at lower than about 5 Torr pressure. Preferably and typically, the resultant film will consist essentially of TiN, with the film having in excess of 99% TiN by volume.

25 Claims, 3 Drawing Sheets

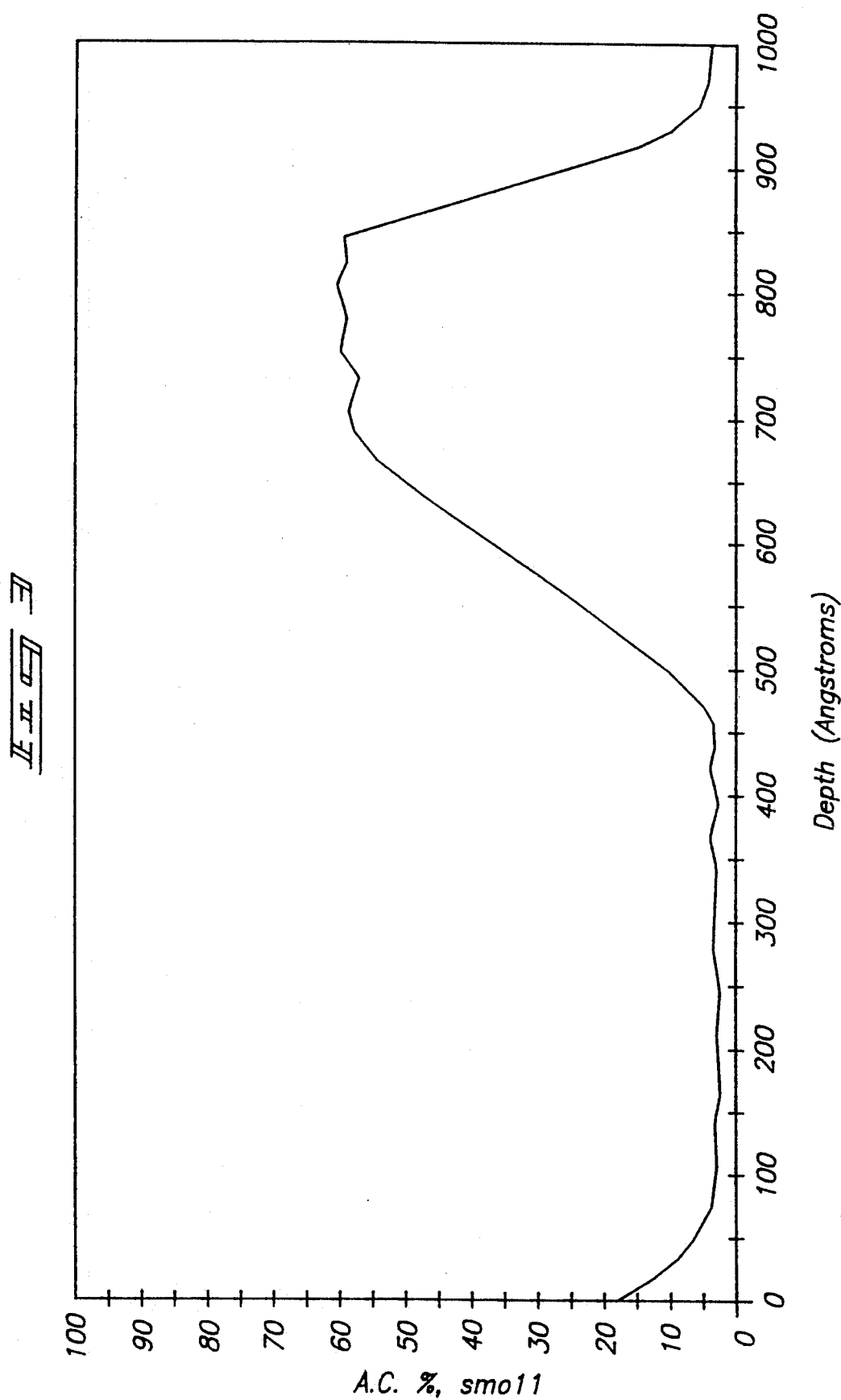

METHOD OF DEPOSITING HIGH DENSITY TITANIUM NITRIDE FILMS ON SEMICONDUCTOR WAFERS

TECHNICAL FIELD

This invention relates generally to deposition of titanium nitride (TiN) films.

BACKGROUND OF THE INVENTION

In the processing of integrated circuits, electric contact must be made to isolated active device regions formed within a wafer/substrate. The active device regions are connected by high electrically conductive paths or lines which are fabricated above an insulator material, which covers the substrate surface. To provide electrical connection between the conductive path and active-device regions, an opening in the insulator is provided to enable the conductive films to contact the desired regions. Such openings are typically referred to as contact openings, or simply "contacts".

As transistor active area dimensions approached one micron in diameter, conventional process parameters resulted in intolerable increased resistance between the active region or area and the conductive layer. The principal way of reducing such contact resistance is by formation of a metal silicide atop the active area prior to application of the conductive film for formation of the conductor runner. One common metal silicide material formed is $TiSi_x$, where x is predominantly "2". The $TiSi_x$ material is typically provided by first applying a thin layer of titanium atop the wafer which contacts the active areas within the contact openings. Thereafter, the wafer is subjected to a high temperature anneal. This causes the titanium to react with the silicon of the active area, thus forming the $TiSi_x$. Such a process is said to be self-aligning, as the $TiSi_x$ is only formed where the titanium metal contacts the silicon active regions. The applied titanium film everywhere else overlies an insulative, and substantially non-reactive $SiO_2$ layer.

Ultimately, an electrically conductive contact filling material such as tungsten would be provided for making electrical connection to the contact. However, tungsten adheres poorly to $TiSi_x$. Additionally, it is desirable to prevent intermixing of the contact filling material with the silicide and underlying silicon. Accordingly, an intervening layer is typically provided to prevent the diffusion of the silicon and silicide with the plug filling metal, and to effectively adhere the plug filling metal to the underlying substrate. Such material is, accordingly, also electrically conductive and commonly referred to as a "barrier layer" due to the anti-diffusion properties.

One material of choice for use as a glue/diffusion barrier layer is titanium nitride. TiN is an attractive material as a contact diffusion barrier in silicon integrated circuits because it behaves as an impermeable barrier to silicon, and because the activation energy for the diffusion of other impurities is very high. TiN is also chemically thermodynamically very stable, and it exhibits typical low electrical resistivities of the transition metal carbides, borides, or nitrides.

TiN can be provided or formed on the substrate in one of the following manners: a) by evaporating Ti in an $N_2$ ambient; b) reactively sputtering Ti in an Ar and $N_2$ mixture; c) sputtering from a TiN target in an inert (Ar) ambient; d) sputter depositing Ti in an Ar ambient and converting it to TiN in a separate plasma nitridation step; or e) by low pressure chemical vapor deposition.

As device dimensions continue to shrink, adequate step coverage within the contact has become problematical with respect to certain deposition techniques. Chemical vapor destination is known to deposit highly conformal layers, and would be preferable for this reason in depositing into deep, narrow contacts. One example prior art technique for depositing TiN is by a low pressure chemical vapor deposition at pressures of less than 1 Torr. Specifically, an example is the reaction of a titanium organometallic precursor of the formula $Ti(N(CH_3)_2)_4$, commonly referred to as TMAT, and ammonia in the presence of a carrier gas according to the following formula:

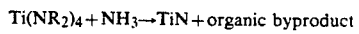

$$Ti(NR_2)_4 + NH_3 \rightarrow TiN + \text{organic byproduct}$$

It is typically desirable in low pressure chemical vapor deposition processes to operate at as low a pressure as possible to assure complete evacuation of potentially undesirable reactive and contaminating components from the chamber. Even small amounts of these materials can result in a significant undesired increase in resistivity. For example, oxygen incorporation into the film before and after deposition results in higher resistivity.

One chemical vapor deposition method has been reported which results in reduced resistivity. Such is described in Katz, "*Ohmic Contacts To InP-Based Materials Induced By Means Of Rapid Thermal Low Pressure (Metallorganic) Chemical Vapor Deposition Technique*", Journal Of Electronic Materials, Vol. 20, No. 12, pp. 1069–73 (1991) and Katz et al., "*The Influence Of Ammonia On Rapid-Thermal Low-Pressure Metalorganic Chemical Vapor Deposited $TiN_x$ Films From Tetrakis (dimethylamido) Titanium Precursor Onto InP*", Journal Of Applied Physics, 71(2), pp. 993–1000, Jan. 15, 1992. This process utilizes "rapid thermal" low pressure chemical vapor deposition, in which a wafer is first placed in reactor and the reactor is then sealed. The reactor is then evacuated, and reactive gases are then injected into the reactor which has a cold or unheated environment therein, and an unheated wafer, at this point in the process. Then heat is essentially instantly applied to the wafer to rapidly (within seconds) heat the wafer to the desired process temperature, thus the term "rapid thermal". Such "rapid thermal" processes, however, are not known to have been implemented in a mass production environment at the time of this writing.

It will be noted that the Katz and Katz et al. articles report reduced resistivity at the less conventional process pressures of greater than 5 Torr. Such articles also, however, report substantially constant etch rates despite increasing pressure. Etch rate is generally inversely proportional to density. High density is desired in the resultant TiN film to maximize its diffusion barrier properties. Lower density TiN films do not function as effectively as diffusion barrier materials.

Accordingly, it would be desirable to develop a process for maximizing density of TiN films, while enabling taking advantage of the good conformal deposition provided by CVD techniques.

BRIEF DESCRIPTION OF THE DRAWINGS

Preferred embodiments of the invention are described below with reference to the following accompanying drawings.

FIG. 3 is a graph of oxygen content in a.c. % (accumulated counts percentage) as a function of depth of a TiN film deposited in accordance with the invention.

DETAILED DESCRIPTION OF THE PREFERRED EMBODIMENTS

Figure 1:
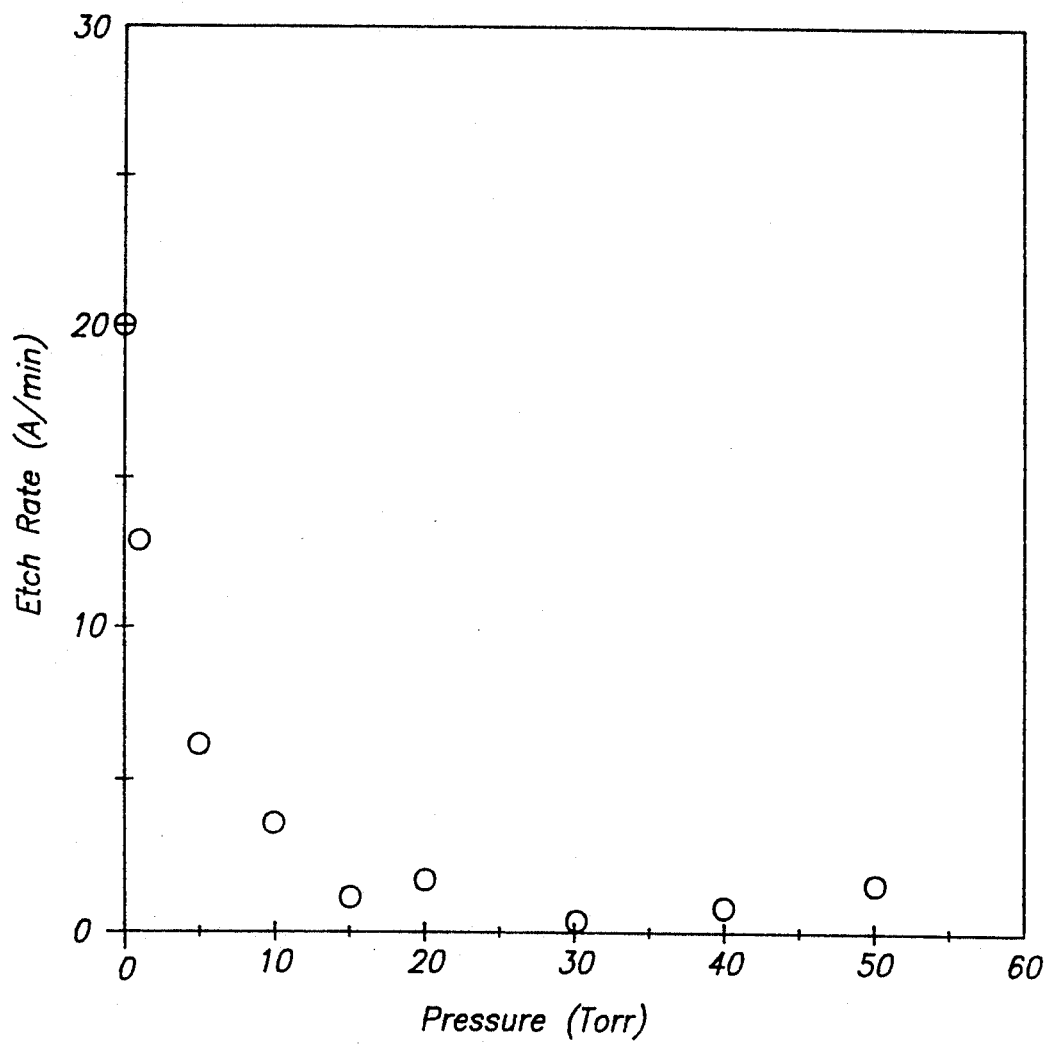
FIG. 1 is a graph or plot of etch rate as a function of pressure of chemical vapor deposited TiN films.

This disclosure of the invention is submitted in furtherance of the constitutional purposes of the U.S. Patent Laws "to promote the progress of science and useful arts" (Article 1, Section 8).

In accordance with the invention, disclosed is a chemical vapor deposition method of providing a conformal layer of TiN atop a semiconductor wafer in a manner which increases density and reduces etch rate of the TiN layer. The method comprises: a) positioning a wafer within a chemical vapor deposition reactor; b) heating the positioned wafer to a selected processing temperature of from about 200° C. to about 600° C.; c) injecting selected quantities of a gaseous titanium organometallic precursor of the formula $Ti(NR_2)_4$, where R is selected from the group consisting of H and a carbon containing radical; gaseous ammonia; and a carrier gas to within the reactor having the positioned preheated wafer therein; and d) maintaining the reactor at a pressure of from about 5 Torr to about 100 Torr and the wafer at a selected elevated temperature which in combination are effective for reacting the precursor and ammonia to deposit a film on the wafer which comprises TiN, the film having increased density and a reduced etch rate over films deposited by the same method but at lower than about 5 Torr pressure. Preferably and typically, the resultant film will consist essentially of TiN, with the film having in excess of 99% TiN by volume.

It has been discovered that utilization of these higher pressures in the range from 5 Torr to about 100 Torr in combination with wafer pre-heat significantly reduces the etching rate and correspondingly increases density of the deposited film as compared to the experimental "rapid thermal" process of the prior art. As an added side benefit, TiN films deposited in accordance with the invention are capable of being exposed to the atmosphere for an extended period of time with there being no appreciable increase in resistivity of the so deposited film.

The preferred pressure for the inventive process is from about 15 Torr to about 50 Torr, with about 30 Torr being most preferred. The preferred temperature range is from about 400° C. to about 500° C. Example titanium organometallic precursors include $Ti(N(CH_3)_2)_4$ and $Ti(N(C_2H_5)_2)_4$. The invention was reduced to practice using $Ti(N(CH_3)_2)_4$.

The quantities of gases fed to the chemical vapor deposition reactor are preferably selected to provide a volumetric ratio of the titanium organometallic precursor to ammonia of from 1:50 to 1:5, with about 1:30 being most preferred. A flow of carrier gas is provided to control the gas distribution above the wafer surface to obtain good uniformity of the film deposited across the wafer. The preferred carrier gas is a noble gas, such as helium or argon, with the preferred flow rate of such gas being from about 20 standard cubic centimeters per minute (sccm) to about 200 sccm. The most preferred flow rate is believed to be about 50 sccm.

With a CVD reactor of about six liters, the preferred flow rate for the titanium organometallic precursor is about 20 sccm, with a preferred flow rate of ammonia being about 300 sccm. The carrier gas flow rate under such circumstances is preferably 50 sccm, with temperature and pressure preferably maintained at 450° C. and 20 Torr, respectively. Under such conditions, the desired film will be deposited at an estimated rate of approximately 500 Angstroms per minute. The typical thickness of the deposited barrier metal layer in today's technology is about 500 Angstroms.

FIG. 1 is a plot of etch rate versus deposition pressure for various deposited TiN films. All such deposition techniques were the same, except for the indicated pressure differences. Such were deposited by feeding TMAT, ammonia and helium at flow rates of 5 sccm, 200 sccm and 50 sccm, respectively. Reactor and wafer temperature was pre-heated to 350° C. and maintained throughout processing. After deposition, the wafers were exposed to ambient atmosphere for approximately 24 hours. The films were then wet etched using a 1:1 volume ratio of $NH_4OH$ and $H_2O_2$ at about 25° C. The results are reported in FIG. 1. As is apparent from FIG. 1, appreciable and considerable etch rate drop occurs at deposition pressures of 5 Torr or greater where reactor and wafer pre-heat are used. The same qualitative results would occur using a dry etch, as opposed to a wet etch.

Oxygen content of variously deposited films was also examined. Such analysis showed that oxygen content of the films went from 20% to 3% or less (by volume) as the process pressure was increased from 0.45 to 20 Torr. It is believed that, at the gas flow rates of He, $NH_3$ and TMAT used to reach the higher process pressures, the fraction of residual oxygen in the chamber is lower giving rise to less oxygen incorporation in the films. In addition, the film quality is believed to be less porous (more dense), resulting in less or negligible oxygen incorporation when the finished layer is exposed to atmosphere. Such lower oxygen incorporation also accounts for lower resistivity of the films deposited at the higher process pressures.

Figure 2:
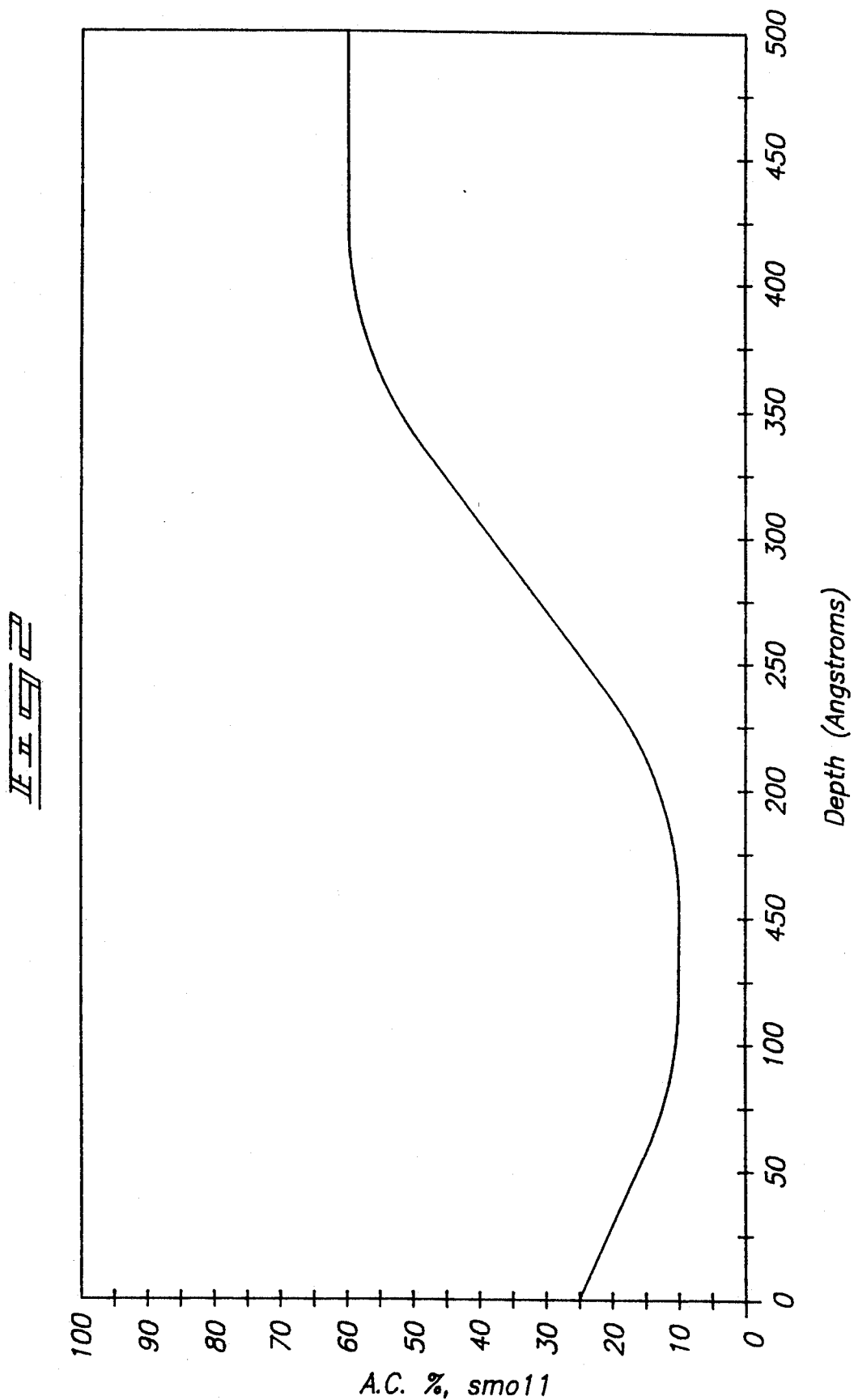
FIG. 2 is a graph of oxygen content in a.c. % (accumulated counts percentage) as a function of depth of a prior art TiN deposited film.

FIG. 2 is a plot of accumulated counts versus film depth from an Auger Electron Microscopy analysis of a TiN film deposited at a prior art reactor pressure of 0.5 Torr, and with reactor and wafer pre-heat. Temperature was 350° C. TMAT flow was 50 sccm, while $NH_3$ flow was 400 sccm. FIG. 3 is a plot of accumulated counts versus film depth from an Auger Electron Microscopy analysis of a TiN film deposited at a reactor pressure of 25 Torr, and with reactor and wafer pre-heat. Again, temperature was 350° C. Again, TMAT flow was 50 sccm, while $NH_3$ flow was 400 sccm. The plots indicate that considerably less oxygen is incorporated down to 500 Angstroms in the film deposited in accordance with the invention, as opposed to the 0.5 Torr deposited film.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A chemical vapor deposition method of providing a conformal layer of TiN atop a semiconductor wafer in a manner which increases density and reduces etch rate of the TiN layer, the method comprising the following steps:

positioning a wafer within a chemical vapor deposition reactor;

heating the positioned wafer to a selected processing temperature of from about 200° C. to about 600° C.;

injecting selected quantities of a gaseous titanium organometallic precursor of the formula $Ti(NR_2)_4$, where R is selected from the group consisting of H and a carbon containing radical; gaseous ammonia; and a carrier gas to within the reactor having the positioned preheated wafer therein; and maintaining the reactor at a pressure of from about 5 Torr to about 100 Torr and the wafer at a selected elevated temperature which in combination are effective for reacting the precursor and ammonia to deposit a film on the wafer which comprises TiN, the film having increased density and reduced etch rate over films deposited by the same method but at lower than about 5 Torr pressure.

2. The chemical vapor deposition method of claim 1 wherein the pressure is from about 15 Torr to about 50 Torr.

3. The chemical vapor deposition method of claim 1 wherein the pressure is about 30 Torr.

4. The chemical vapor deposition method of claim 1 wherein the selected temperature is from about 400° C. to about 500° C.

5. The chemical vapor deposition method of claim 1 wherein the pressure is from about 15 Torr to about 50 Torr, and the selected temperature is from about 400° C. to about 500° C.

6. The chemical vapor deposition method of claim 1 wherein the quantities of gases are selected to provide a volumetric ratio of titanium organometallic precursor to ammonia of from 1:50 to 1:5.

7. The chemical vapor deposition method of claim 1 wherein the carrier gas comprises at least one noble gas, the quantity of carrier gas being from about 20 sccm to about 200 sccm.

8. The chemical vapor deposition method of claim 1 wherein the titanium organometallic precursor consists essentially of $Ti(N(CH_3)_2)_4$.

9. The chemical vapor deposition method of claim 1 wherein the titanium organometallic precursor consists essentially of $Ti(N(CH_3)_2)_4$, and the pressure is from about 15 Torr to about 50 Torr.

10. The chemical vapor deposition method of claim 1 wherein the titanium organometallic precursor consists essentially of $Ti(N(CH_3)_2)_4$, the pressure is from about 15 Torr to about 50 Torr, and the selected temperature is from about 400° C. to about 500° C.

11. The chemical vapor deposition method of claim 1 wherein the titanium organometallic precursor consists essentially of $Ti(N(C_2H_5)_2)_4$.

12. The chemical vapor deposition method of claim 1 wherein the titanium organometallic precursor consists essentially of $Ti(N(C_2H_5)_2)_4$, and the pressure is from about 15 Torr to about 50 Torr.

13. The chemical vapor deposition method of claim 1 wherein the titanium organometallic precursor consists essentially of $Ti(N(C_2H_5)_2)_4$, the pressure is from about 15 Torr to about 50 Torr, and the selected temperature is from about 400° C. to about 500° C.

14. A chemical vapor deposition method of providing a conformal layer of TiN atop a semiconductor wafer in a manner which increases density and reduces etch rate of the TiN layer, the method comprising the following steps:

positioning a wafer within a chemical vapor deposition reactor;

heating the positioned wafer to a selected processing temperature of from about 200° C. to about 600° C.;

injecting selected quantities of a gaseous titanium organometallic precursor of the formula $Ti(NR_2)_4$, where R is selected from the group consisting of H and a carbon containing radical; gaseous ammonia; and a carrier gas to within the reactor having the positioned preheated wafer therein; and maintaining the reactor at a pressure of from about 5 Torr to about 100 Torr and the wafer at a selected elevated temperature which in combination are effective for reacting the precursor and ammonia to deposit a film on the wafer which consists essentially of TiN, the film having increased density and reduced etch rate over films deposited by the same method but at lower than about 5 Torr pressure.

15. The chemical vapor deposition method of claim 14 wherein the pressure is from about 15 Torr to about 50 Torr.

16. The chemical vapor deposition method of claim 14 wherein the pressure is about 30 Torr.

17. The chemical vapor deposition method of claim 14 wherein the selected temperature is from about 400° C. to about 500° C.

18. The chemical vapor deposition method of claim 14 wherein the pressure is from about 15 Torr to about 50 Torr, and the selected temperature is from about 400° C. to about 500° C.

19. The chemical vapor deposition method of claim 14 wherein the quantities of gases are selected to provide a volumetric ratio of titanium organometallic precursor to ammonia of from 1:50 to 1:5.

20. The chemical vapor deposition method of claim 14 wherein the titanium organometallic precursor consists essentially of $Ti(N(CH_3)_2)_4$.

21. The chemical vapor deposition method of claim 14 wherein the titanium organometallic precursor consists essentially of $Ti(N(CH_3)_2)_4$, and the pressure is from about 15 Torr to about 50 Torr.

22. The chemical vapor deposition method of claim 14 wherein the titanium organometallic precursor consists essentially of $Ti(N(CH_3)_2)_4$, the pressure is from about 15 Torr to about 50 Torr, and the selected temperature is from about 400° C. to about 500° C.

23. The chemical vapor deposition method of claim 14 wherein the titanium organometallic precursor consists essentially of $Ti(N(C_2H_5)_2)_4$.

24. The chemical vapor deposition method of claim 14 wherein the titanium organometallic precursor consists essentially of $Ti(N(C_2H_5)_2)_4$, and the pressure is from about 15 Torr to about 50 Torr.

25. The chemical vapor deposition method of claim 14 wherein the titanium organometallic precursor consists essentially of $Ti(N(C_2H_5)_2)_4$, the pressure is from about 15 Torr to about 50 Torr, and the selected temperature is from about 400° C. to about 500° C.

* * * * *